United States Patent
Chen et al.

[11] Patent Number: 6,165,596
[45] Date of Patent: Dec. 26, 2000

[54] MULTI-LAYER INSULATED METAL SUBSTRATE PRINTED WIRING BOARD HAVING IMPROVED THERMAL COUPLING OF COMPONENTS

[75] Inventors: Shiaw-Jong Chen, Plano; Robert E. Radke, Garland, both of Tex.

[73] Assignee: Lucent Technologies, Inc., Murray Hill, N.J.

[21] Appl. No.: 09/418,102

[22] Filed: Oct. 14, 1999

[51] Int. Cl.[7] .................. B32B 3/00; H05K 1/03; H05K 1/11; H01L 23/02
[52] U.S. Cl. .................. 428/209; 174/250; 174/255; 174/256; 361/795; 361/803; 257/685; 257/686
[58] Field of Search .................. 428/209; 174/250, 174/255, 260; 361/795, 796, 799, 803; 257/685, 686, 688, 689

[56] References Cited

U.S. PATENT DOCUMENTS

| | | | |
|---|---|---|---|
| 4,574,879 | 3/1986 | DeGree et al. | 165/185 |
| 4,602,678 | 7/1986 | Fick | 165/79 |
| 4,810,563 | 3/1989 | DeGree et al. | 428/209 |
| 5,784,782 | 7/1998 | Boyko et al. | 156/289 |
| 5,969,945 | 10/1999 | Cutting et al. | 174/254 |

*Primary Examiner*—Cathy Lam
*Attorney, Agent, or Firm*—Locke Liddell & Sapp LLP

[57] ABSTRACT

An insulated metal substrate printed wiring board includes a thermally conductive base plate. A first dielectric layer is disposed on the base plate. An electrically conductive trace is disposed on the top surface of the first dielectric layer. A second dielectric layer is disposed on the top surface of the first electrically conductive trace. A second electrically conductive trace is disposed on the top surface of the second dielectric layer. The second dielectric layer and the second electrically conductive trace include an aperture to expose the electrically conductive trace disposed on the top surface of the first dielectric layer. High power dissipating components are mounted through the aperture in the second electrically conductive layer and second dielectric layer for electrical connection to the electrically conductive trace disposed on the top surface of the first dielectric layer. Similar construction can be extended to more than two layers of electrically conductive traces and the aperture is through all the layers except the first dielectric layer and the first electrically conductive layer.

12 Claims, 3 Drawing Sheets

MULTI-LAYER INSULATED METAL SUBSTRATE PRINTED WIRING BOARD HAVING IMPROVED THERMAL COUPLING OF COMPONENTS

TECHNICAL FIELD OF THE INVENTION

The present invention relates to multi-layer insulated metal substrate printed wiring boards, and more particularly an insulated metal substrate board having cutouts formed in the upper electrically conductive and dielectric layers of the printed wiring board for achieving improved thermal coupling of high power dissipation components to the insulated metal base plate, and methods for assembling components onto such boards including the dispensing of solder paste.

BACKGROUND OF THE INVENTION

Insulated metal substrate (IMS) printed wiring board (PWB) construction includes either a single layer or two or more layer laminate having a surface mount printed circuit arrangement for receiving and mounting electrical components such as, for example, semiconductor devices thereon. The arrangement utilizes a plurality of electrically insulative and thermally conductive layers disposed on a highly thermal conductive layer which serves as the base layer for the assembly. The other layer forming the opposed surface normally serves as a circuitry array and/or surface mounting pad or arrangement for one or more solid state devices.

The two or more layer construction allows higher circuit trace density and the ability to route traces otherwise not possible in a single layer configuration. However, a two layer construction has a thermal resistance of about 2.5 to 3 times the thermal resistance of a single layer construction. Therefore, high power dissipating components are not as efficiently coupled to the metal base plate. Only about one-half of the power can be packaged into a two layer construction as compared to a single layer IMS. Therefore, the use of a two or more layer IMS construction has been employed in very limited applications.

A need has thus arisen for an improved IMS PWB with a two or more layer laminate and the capability of mounting high power dissipating components to the internal layer to yield improved thermal coupling to the metal substrate while improving the routing density over single layer IMS PWBs. Additional needs have developed for manufacturing methods of solder paste dispensing in the assembly process using such IMS PWBs.

SUMMARY OF THE INVENTION

In accordance with the present invention, an insulated metal substrate printed wiring board includes a thermally conductive base plate. A first dielectric layer is disposed on the base plate. An electrically conductive trace is disposed on the top surface of the first dielectric layer. A second dielectric layer is disposed on the top surface of the first electrically conductive trace. A second electrically conductive trace is disposed on the top surface of the second dielectric layer. The second dielectric layer and the second electrically conductive trace include an aperture to expose the electrically conductive trace disposed on the top surface of the first dielectric layer. High power dissipating components are mounted through the aperture in the second electrically conductive layer and second dielectric layer for electrical connection to the electrically conductive trace disposed on the top surface of the first dielectric layer. Similar construction can be extended to more than two layers of electrically conductive traces and the aperture is through all the layers except the first dielectric layer and the first electrically conductive layer.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
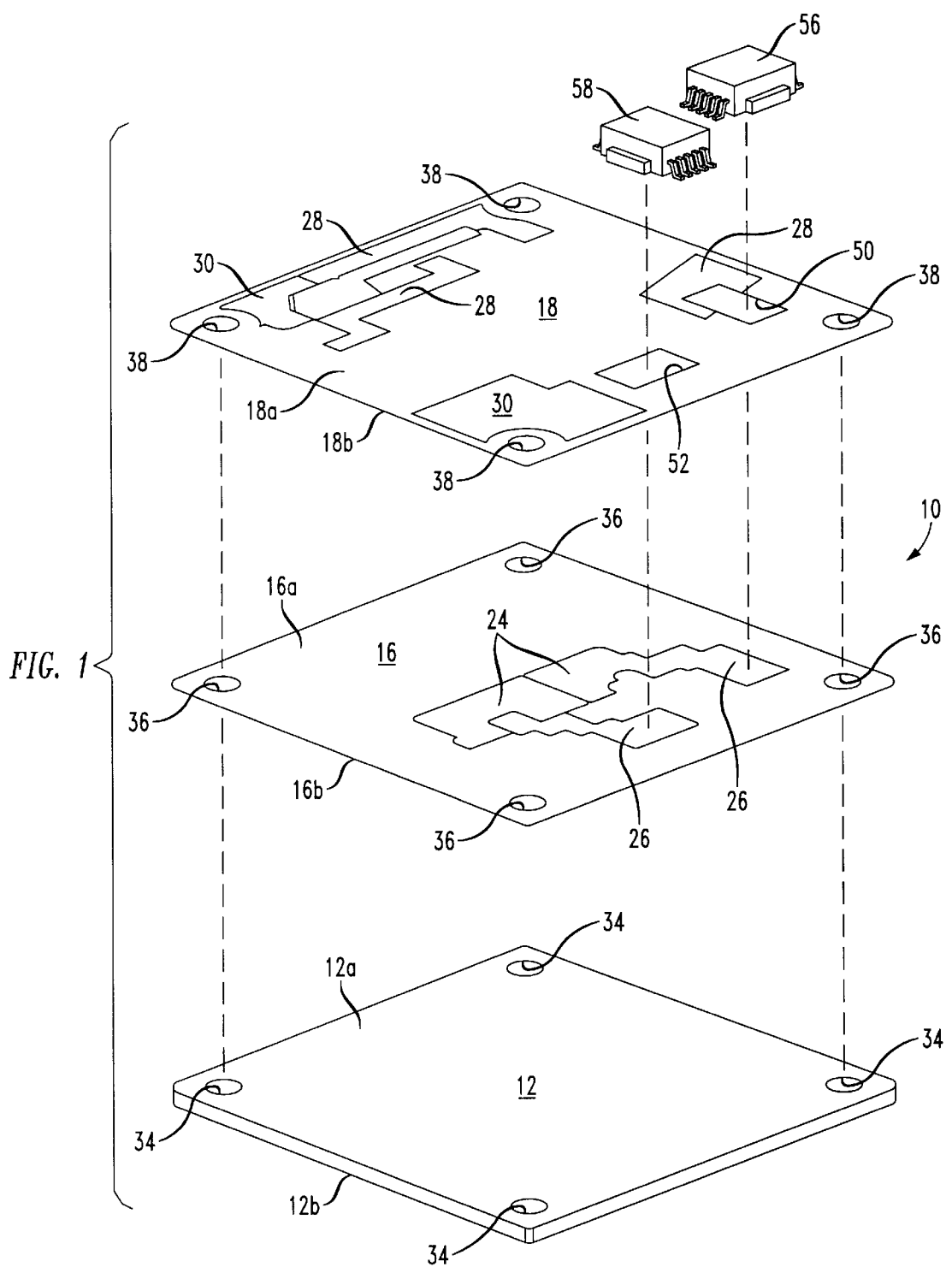
FIG. 1 is an exploded perspective view of the present IMS PWB.
Figure 2:
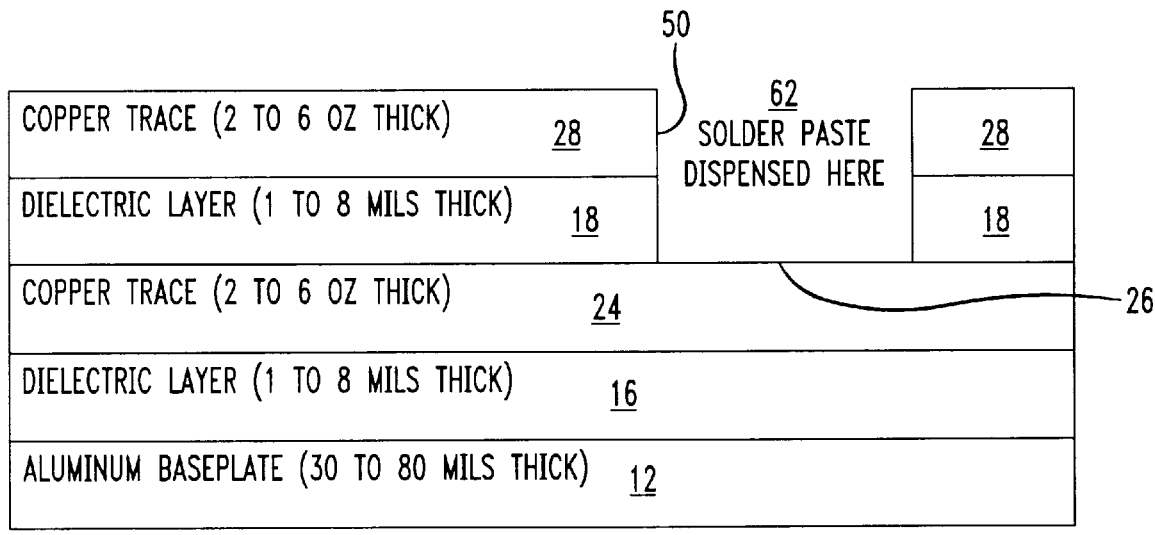
FIG. 2 is a diagrammatic illustration of the multiple layers of the present IMS PWB, and further pictorially illustrates solder dispensing in accordance with the present invention.

Referring simultaneously to FIGS. 1 and 2, the present IMS PWB is illustrated, and is generally identified by the numeral 10. Printed wiring board 10 includes a base plate 12 having a top surface 12a and a bottom surface 12b. Disposed above top surface 12a of base plate 12 is a first dielectric layer 16 having a top surface 16a and a bottom surface 16b. Bottom surface 16b of dielectric layer 16 is disposed adjacent to top surface 12a of base plate 12.

Disposed on top surface 16a of first dielectric layer 16 is an electrically conductive layer including traces 24 and pads 26. Disposed on top surface 18a of second dielectric layer 18 is an electrically conductive layer including traces 28 and pads 30.

Base plate 12 has a cross-sectional thickness of, for example, approximately 30 to 80 mils, but is not limited to these thicknesses. Base plate 12 may be fabricated from a thermally conductive material such as, for example, copper, aluminum, steel, zinc, copper-invar-copper, copper-molybdenum-copper, Al—SiC, and other high thermal conductive materials. Dielectric layers 16 and 18 have a cross-sectional thickness of, for example, approximately 1 to 8 mils, and may be fabricated from polyimide, epoxy, polytetrafluoroethylene (PTFE) or other polymers. Electrically conductive traces 24 and 28, and pads 26 and 30 may comprise, for example, copper having a thickness of, for example, approximately 2 to 6 ounces or more. Traces 24 and 28, and pads 26 and 30 may be created from electrolytically formed copper and can be mechanically rolled or otherwise treated to reach or achieve the desired circuit configuration. In certain instances, electro-refined or electro-deposited copper can be utilized. A flash coating of metallic nickel may be used to provide a desirable surface, and reduces the likelihood or tendency to form surface oxides of copper. For a more complete description of the construction of base plate 12, and dielectric layers 16 and 18, reference is made to U.S. Pat. No. 4,810,563, whose description and drawings are hereby incorporated by reference.

Base plate 12, dielectric layer 16 and dielectric layer 18 include mounting apertures 34, 36, and 38, respectively which are in alignment for mounting PWB 10 to a chassis or other component in a final assembly.

In accordance with the present invention, dielectric layer 18 and electrically conductive trace 30 include a plurality of apertures to allow high power dissipating components to be mounted directly to the pads 26 on the first conductive trace 24. FIG. 1 illustrates apertures 50 and 52 to allow mounting of high power dissipating electrical components 56 and 58 to pads 26 of first conductive trace 24. Although apertures 50 and 52 are illustrated as rectangles, it is understood that any shaped apertures can be utilized with the present invention depending upon the shape of the component to be mounted to PWB 10. Apertures 50 and 52 expose pads 26 through second dielectric layer 18 to thereby allow components 56 and 58 to be directly mounted to electrically conductive trace 24 resulting in a single electrically conductive trace and dielectric layer being disposed between components 56 and 58 and base plate 12 to improve the thermal coupling between components 56, 58 and base plate 12. These high power dissipating components are therefore mounted such that only one dielectric layer and electrically conductive trace are in the thermal path to the base plate 12 and improved thermal coupling of these components to base plate 12 results while the advantages of high routing density associated with a two or more layer IMS PWB is achieved.

Figure 3:
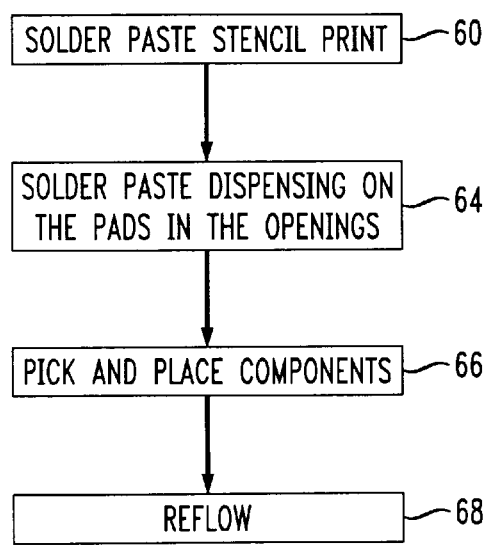
FIG. 3 is a block diagram illustrating steps of the present method.

Since PWB 10 has mounting pads 26 at a lower surface level, approximately 10 mils lower, than surface 28 of electrically conductive layer 28, PWB 10 is not fully compatible with conventional surface mount stencil printing processes utilized for applying solder paste to printed wiring board surfaces. Therefore, in accordance with the present invention, additional assembly process steps are required to solder components 56 and 58 through apertures 50 and 52 to pads 26. As illustrated in FIGS. 2 and 3, solder paste is stencil printed at step 60. This print is disposed on the top surface of pad 30. Solder paste 62 is then dispensed through apertures 50 and 52 onto pads 26 at step 64. Components 56 and 58 are then picked and placed within apertures 50 and 52 at step 66. The solder paste is then reflowed at step 68 to form electrical contact between components 56 and 58 and pads 26.

Figure 4:
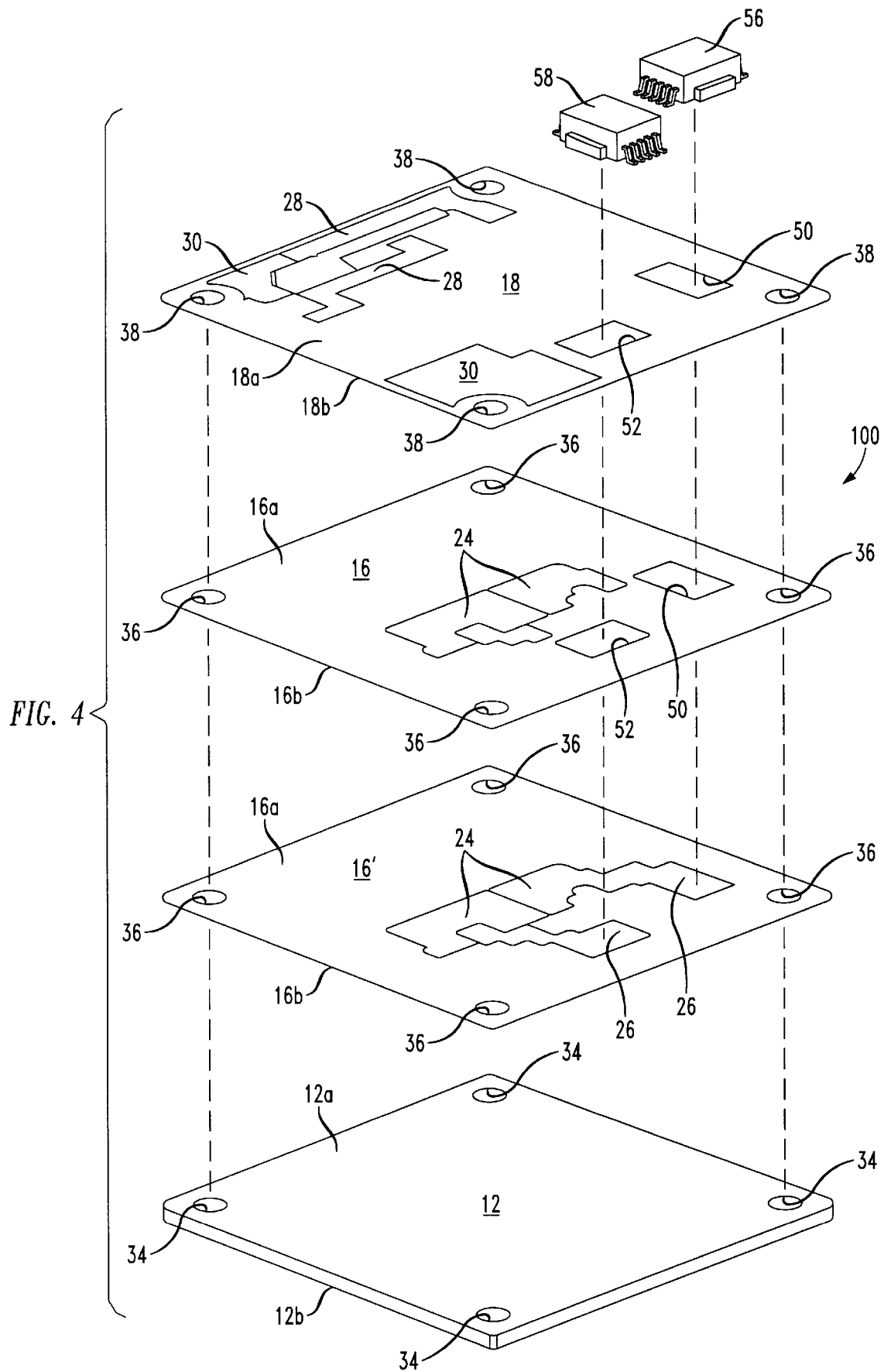
FIG. 4 is an exploded perspective view of a further embodiment of the present IMS PWB.

Referring now to FIG. 4, an additional embodiment of the present IMS PWB is illustrated, and is generally identified by the numeral 100. Like numerals are used in FIG. 4 for like and corresponding components previously discussed with respect to FIG. 1. PWB 100 includes an additional dielectric layer 16' disposed between dielectric layer 16 and base plate 12. Any number of intermediate dielectric layers and electrically conductive layers disposed between dielectric layer 18 and base plate 12 may be utilized with the present invention. Apertures 50 and 52 are cut in dielectric layer 16 to expose pads 26 on dielectric layer 16'. Components 56 and 58 therefore can be mounted through dielectric layer 18 and dielectric layer 16 for mounting on dielectric layer 16'.

The present invention can be expanded to any number of intermediate dielectric layers and electrically conductive layers between top layer 18 and base plate 12, FIG. 4 illustrating two intermediate layers 16 and 16', for illustrative purposes only. One or more intermediate layers 16' may include apertures 50 and 52 for mounting of components 56 and 58 to electrically conductive layer 24 disposed below the layers having apertures 50 and 52, and which is disposed with a less resistant thermal path to base plate 12.

It therefore can be seen that the present invention provides for a two or more layer IMS PWB having improved thermal coupling of power dissipating components, and provides for methods of assembly using such boards having apertures in the top layer for the soldering of components to the internal layer.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A printed wiring board for mounting high power dissipating components comprising:

a thermally conductive base plate for dissipating heat produced by the components;

a first dielectric layer having a top surface and a bottom surface, said bottom surface thereof disposed on said base plate;

an electrically conductive trace disposed on said top surface of said first dielectric layer;

a second dielectric layer having a top surface and a bottom surface, said bottom surface thereof disposed on said top surface of said first dielectric layer; and said second dielectric layer including an aperture for exposing said electrically conductive trace on said top surface of said first dielectric layer, such that the components are mounted through said aperture for electrical contact with said exposed electrically conductive trace, thereby locating the components in close proximity to said base plate for enhancing thermal coupling between the components and said base plate.

2. The printed wiring board of claim 1 and further including an electrically conductive trace disposed on said top surface of said second dielectric layer.

3. The printed wiring board of claim 1 wherein said base plate is selected from the group consisting of copper, aluminum, steel, zinc, copper-invar-copper, copper-molybdenum-copper, and Al-SiC.

4. The printed wiring board of claim 1 wherein said electrically conductive trace comprises copper.

5. The printed wiring board of claim 1 wherein said dielectric layers include polyimide.

6. The printed wiring board of claim 1 and further including solder paste disposed within said at least one aperture.

7. A printed wiring board for mounting high power dissipating components comprising:

a thermally conductive base plate for dissipating heat produced by the components;

a top dielectric layer;

a plurality of intermediate dielectric layers, each of said intermediate layers having an electrically conductive trace, said intermediate dielectric layers being disposed between said base plate and said top dielectric layer; and said top dielectric layer and at least one of said intermediate dielectric layers including an aperture for exposing an electrically conductive trace on one of said intermediate dielectric layers, such that the components are mounted through said aperture for electrical contact with said exposed electrically conductive trace, thereby locating the components in close proximity to said base plate for enhancing thermal coupling between the components and said base plate.

8. The printed wiring board of claim 7 and further including an electrically conductive trace disposed on said top dielectric layer.

9. The printed wiring board of claim 7 wherein said base plate is selected from the group consisting of copper, aluminum, steel, zinc, copper-invar-copper, copper-molybdenum-copper, and Al—SiC.

10. The printed wiring board of claim 7 wherein said electrically conductive trace comprises copper.

11. The printed wiring board of claim 7 wherein said dielectric layers include polyimide.

12. The printed wiring board of claim 7 and further including solder paste disposed within said aperture.

\* \* \* \* \*